United States Patent
Kao et al.

(10) Patent No.: US 9,344,071 B2
(45) Date of Patent: May 17, 2016

(54) CLOCK SIGNAL DISTRIBUTION POWER EFFICIENCY IMPROVEMENT

(71) Applicant: FUJITSU LIMITED, Kawasaki-shi, Kanagawa (JP)

(72) Inventors: Shuo-Chun Kao, Sunnyvale, CA (US); Nikola Nedovic, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/464,500

(22) Filed: Aug. 20, 2014

(65) Prior Publication Data

US 2016/0056804 A1    Feb. 25, 2016

(51) Int. Cl.
*H03L 7/24*    (2006.01)
*H03K 5/00*    (2006.01)
*H03K 3/03*    (2006.01)

(52) U.S. Cl.
CPC .......... *H03K 5/00006* (2013.01); *H03K 3/0315* (2013.01)

(58) Field of Classification Search
CPC ....................................................... H03L 7/24
USPC ................................. 331/55, 2, 46; 327/116
See application file for complete search history.

(56) References Cited

U.S. PATENT DOCUMENTS

2002/0039039 A1* 4/2002 Maligeorgos .................. 327/116
2009/0081961 A1* 3/2009 Rofougaran ..................... 455/76

OTHER PUBLICATIONS

Kangmin Hu; Tao Jiang; Jingguang Wang; O'Mahony, F.; Chiang, P.Y., "A 0.6 mW/Gb/s, 6A-7.2 Gb/s Serial Link Receiver Using Local Injection-Locked Ring Oscillators in 90 nm CMOS," Solid-State Circuits, IEEE Journal of , vol. 45, No. 4, pp. 899,908, Apr. 2010.
Takano, K.; Motoyoshi, M.; Fujishima, M., "4.8GHz CMOS frequency multiplier with subharmonic pulse-injection locking," Solid-State Circuits Conference, 2007. ASSCC '07. IEEE Asian , vol., no., pp. 336,339, Nov. 12-14, 2007 doi: 10.1109/ASSCC.2007.4425699.
Hossain, M.; Carusone, A.C., "A 6.8mW 7.4Gb/s clock-forwarded receiver with up to 300MHz jitter tracking in 65nm CMOS," Solid-State Circuits Conference Digest of Technical Papers (ISSCC), 2010 IEEE International , vol., no., pp. 158,159, Feb. 7-11, 2010.

* cited by examiner

*Primary Examiner* — Arnold Kinkead
(74) *Attorney, Agent, or Firm* — Maschoff Brennan (57) ABSTRACT

A circuit may include a pulse generation circuit configured to receive a first clock signal with a first-clock rate and a first-clock duty cycle. The pulse generation circuit may be configured to generate, based on the first clock signal, a pulse signal with a pulse frequency and with a pulse duty cycle that is smaller than the first-clock duty cycle. The circuit may also include a sub-harmonic injection locking oscillator configured to receive the pulse signal. The sub-harmonic injection locking oscillator may be configured to output, based on the pulse signal, a second clock signal with a second-clock rate that is greater than the first-clock rate and greater than the pulse frequency.

19 Claims, 5 Drawing Sheets

CLOCK SIGNAL DISTRIBUTION POWER EFFICIENCY IMPROVEMENT

FIELD

The embodiments discussed herein are related to improving the power efficiency of distributing a clock signal.

BACKGROUND

High-speed data communication includes clock distribution in which a clock signal may be routed from a clock generator (e.g., an oscillator) to a timing circuit. The distance between the clock generator and the timing circuit may be relatively far, which may result in a large amount of power consumption.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a pulse generation circuit configured to receive a first clock signal with a first-clock rate and a first-clock duty cycle. The pulse generation circuit may be configured to generate, based on the first clock signal, a pulse signal with a pulse frequency and with a pulse duty cycle that is smaller than the first-clock duty cycle. The circuit may also include a sub-harmonic injection locking oscillator configured to receive the pulse signal. The sub-harmonic injection locking oscillator may be configured to output, based on the pulse signal, a second clock signal with a second-clock rate that is greater than the first-clock rate and greater than the pulse frequency The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

High-speed data communication often includes clock distribution in which a clock signal may be routed from a clock generator (e.g., an oscillator) to a destination circuit (e.g., a timing circuit) via one or more distributing elements (e.g., buffers) referred to hereinafter as a clock distributor. In some embodiments, the distance of travel of the clock signal between the clock generator and the destination circuit may be relatively far (e.g., greater than 0.1 millimeters (mm)) such that power may be consumed during the distribution. The amount of power that may be consumed during the distribution of the clock signal from the clock generator to the destination circuit may be related to the frequency of the clock signal (referred to hereinafter as the "clock rate") in which the higher the clock rate the more power may be consumed.

Therefore, according to an aspect of an embodiment, the clock generator may be configured to generate a first clock signal with a first-clock rate that is less than a desired clock rate of the clock at the destination circuit. The first clock signal may be distributed via the distribution circuit to a frequency multiplying circuit that is relatively close (e.g., less than 0.1 mm) to the destination circuit as compared to the distance between the clock generator and the destination circuit. The frequency multiplying circuit may include a pulse generator that may be configured to receive the first clock signal and to generate a pulse signal based on the first clock signal that has a duty cycle that is less than a first-clock duty cycle of the first clock signal. The frequency multiplying circuit may also include a sub-harmonic injection locking oscillator (referred to hereinafter as the "sub-harmonic oscillator") that is configured to receive the pulse signal. The sub-harmonic oscillator may be configured to, based on the pulse signal, generate a second clock signal with a second-clock rate that is substantially equal to the desired clock rate for the destination circuit. The frequency multiplying circuit may then be configured to distribute the second clock signal to the destination circuit, which may be significantly closer to the sub-harmonic oscillator than the clock generator. Accordingly, the first clock signal of which the second clock signal may be based and which may have a lower clock rate than the second clock signal may be distributed over a relative long distance and the second clock signal may be distributed over a relatively short distance.

For example, the power consumption for a clock signal with a clock rate of 12.5 gigahertz (GHz) that is distributed over a distance of 1 mm may be approximately 20 milliwatts (mW). In contrast, the power consumption for a clock signal with a clock rate of 3.125 GHz that is distributed over the distance of 1 mm may be approximately 5 mW.

Therefore, power consumption associated with distributing a desired clock signal to the destination circuit may be reduced as compared to if a clock signal having the desired clock rate were distributed from the clock generator to the destination circuit. Additionally, the frequency multiplying circuit may be configured such that it may be disposed on the same silicon die as the clock generator, the clock distributor, and/or the destination circuit, which may help free up board space.

Embodiments of the present disclosure will be explained with reference to the accompanying drawings.

Figure 1:
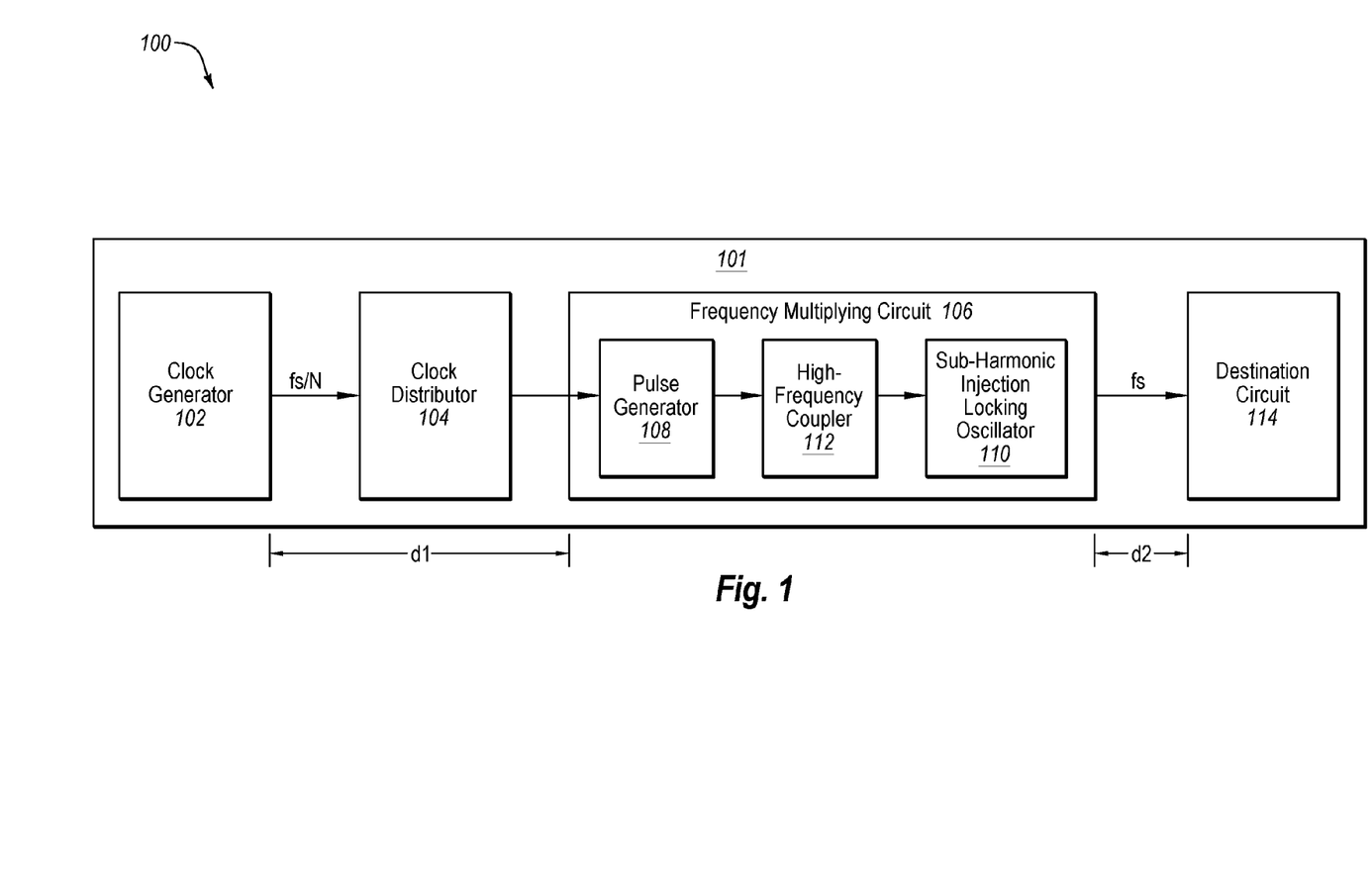
FIG. 1 illustrates an example clock distribution circuit.

FIG. 1 illustrates an example clock distribution circuit 100 ("the circuit 100"), arranged in accordance with at least one embodiment described herein. The circuit 100 may include a clock generator 102, a clock distributor 104, a frequency multiplying circuit 106, and a destination circuit 114. In the illustrated embodiment, the clock generator 102, the clock distributor 104, the frequency multiplying circuit 106, and the destination circuit 114 are depicted as being included on a same encapsulated silicon die 101 such that they may be part of a same chip. In other embodiments, one or more components of the circuit 100 may be included on different chips associated with separate encapsulated silicon dies.

The clock generator 102 may include any suitable system, apparatus, or device that is configured to generate a clock signal. For example, the clock generator 102 may include a phase-locked loop (PLL), which may be an analog, a digital or combination analog and digital PLL. The clock generator 102 may be configured to generate a first clock signal that may have a first-clock rate. In some embodiments, the first-clock rate may be at a frequency that is substantially equal to a sub-harmonic frequency of a desired clock rate. For example, the desired clock rate may be a frequency "fs" and the first-clock rate may have a frequency that is approximately equal to or equal to "fs/N," where "N" may be an integer. In some embodiments, the clock generator 102 may be configured to generate the first clock signal as a differential clock signal and, in other embodiments, the clock generator 102 may be configured to generate the first clock signal as a single ended clock signal.

The clock generator 102 and the clock distributor 104 may be configured such that the first clock may be received by the clock distributor 104. The clock distributor 104 may include any suitable system, apparatus, or device configured to distribute the first clock from the clock generator 102 to the frequency multiplying circuit 106. For example, in some embodiments, the clock distributor 104 may include one or more buffers configured to pass the first clock signal. In some embodiments, the clock generator 102 and the frequency multiplying circuit 106 may be relatively far away from each other (e.g., more than 0.1 mm).

The frequency multiplying circuit 106 may include a pulse generator 108, a high-frequency (H.F.) coupler 112, and a sub-harmonic injection locking oscillator 110 (referred to hereinafter as the "sub-harmonic oscillator 110"). The pulse generator 108 may include any suitable system, apparatus, or device configured to receive the first clock signal from the clock distributor 104 and to generate a pulse signal based on the first clock signal. The pulse signal may be a signal that has a duty cycle that is less than that of the first clock signal. For example, in some embodiments, the first clock signal may have a duty cycle of 50% and the pulse signal may have a duty cycle of less than 30%. In some embodiments, the pulse signal may have a duty cycle as low as 1%.

In some embodiments, the pulse generator 108 may be configured such that a parasitic capacitance at an output of the pulse generator 108 may be reduced or minimized such that the pulse may be sufficiently narrow (e.g., such that the duty cycle of the pulse signal may be sufficiently small).

The pulse generator 108 may be configured such that the frequency of the pulse signal is a sub-harmonic frequency of the desired clock rate "fs." In some embodiments, the pulse generator 108 may be configured such that the frequency of the pulse signal is substantially equal to the clock rate of the first clock signal. In other embodiments, the pulse generator 108 may also be configured as a frequency multiplier in which the frequency of the pulse signal may be higher than the clock rate of the first-clock signal but less than the desired clock rate "fs." For example, in some embodiments, the pulse generator 108 may be configured as a frequency doubler in which the frequency of the pulse signal may be twice the clock rate of the first clock signal and in which the first-clock rate is more than twice as slow as the desired clock rate "fs." By way of example, in some embodiments, the first-clock rate may be a quarter-rate of the desired clock rate "fs" ("fs/4") and the pulse generator 108 may be a frequency doubler in which the frequency of the pulse signal may be a half-rate of the desired clock rate "fs" ("fs/2").

The high-frequency coupler 112 may be disposed between the pulse generator 108 and the sub-harmonic oscillator 110. The high-frequency coupler may be configured to substantially block low frequency components of the pulse signal (e.g., direct current (DC) components) from passing between the pulse generator 108 and the sub-harmonic oscillator 110. Therefore, the high-frequency coupler 112 may filter out low frequency components that may disturb a DC bias of the sub-harmonic oscillator 110. In some embodiments, the high-frequency coupler may include a capacitor, a transistor, and/or a high-pass filter.

The sub-harmonic oscillator 110 may be configured to receive the pulse signal that passes through the high-frequency coupler 112. The sub-harmonic oscillator 110 may be configured to have a free running oscillation frequency that is approximately equal to or equal to the desired clock rate "fs." The sub-harmonic oscillator 110 may be configured to generate a second clock signal with a second-clock rate that is approximately equal to its free running oscillation frequency (e.g., the desired clock rate "fs") based on a received signal with a sub-harmonic frequency with respect to its free running oscillation frequency.

In the illustrated embodiment, the sub-harmonic oscillator 110 may be configured to receive the pulse signal, which, as indicated above, may have a pulse frequency that is a sub-harmonic frequency of the desired clock rate "fs." As such, the sub-harmonic oscillator 110 may be configured to generate the second clock signal with a second-clock rate of approximately "fs" based on the pulse signal.

The sub-harmonic oscillator 110 may include any suitable system, apparatus, or device configured to generate a clock signal based on a sub-harmonic input signal. For example, in some embodiments, the sub-harmonic oscillator 110 may include a ring oscillator, an LC tank oscillator, a standing wave oscillator, etc. In some embodiments, the duty cycle of the pulse signal that may affect the operation of the sub-harmonic oscillator 110 in which a shorter duty cycle of the pulse signal may improve the operation of the sub-harmonic oscillator 110 as compared to a longer duty cycle. As such, in some embodiments, the pulse signal may be configured to have a duty cycle of less than 10% to improve the operation of the sub-harmonic oscillator 110.

The second clock signal that may be output by the sub-harmonic oscillator 110 may be received by the destination circuit 114. As mentioned above, the second clock signal may have a second-clock rate that is approximately equal to or equal to the desired clock rate "fs" for the destination circuit 114. Additionally, the sub-harmonic oscillator 110 may be relatively close to the destination circuit 114 (e.g., less than 0.1 mm) such that a distance d2 over which the second clock signal may travel to the destination circuit 114 may be relatively small as compared to a distance d1 over which the first clock signal may travel to the frequency multiplying circuit 106. Therefore, the amount of power may be reduced as compared to if a clock signal having the desired frequency "fs" were distributed from the clock generator 102 to the destination circuit 114.

Modifications, additions, or omissions may be made to the circuit 100 without departing from the scope of the present disclosure. For example, the differentiation between different circuits of the circuit 100 is merely to aid in the description and is not meant to be limiting. Additionally, the circuit 100 may include any number of components not expressly disclosed or discussed.

Figure 2A:
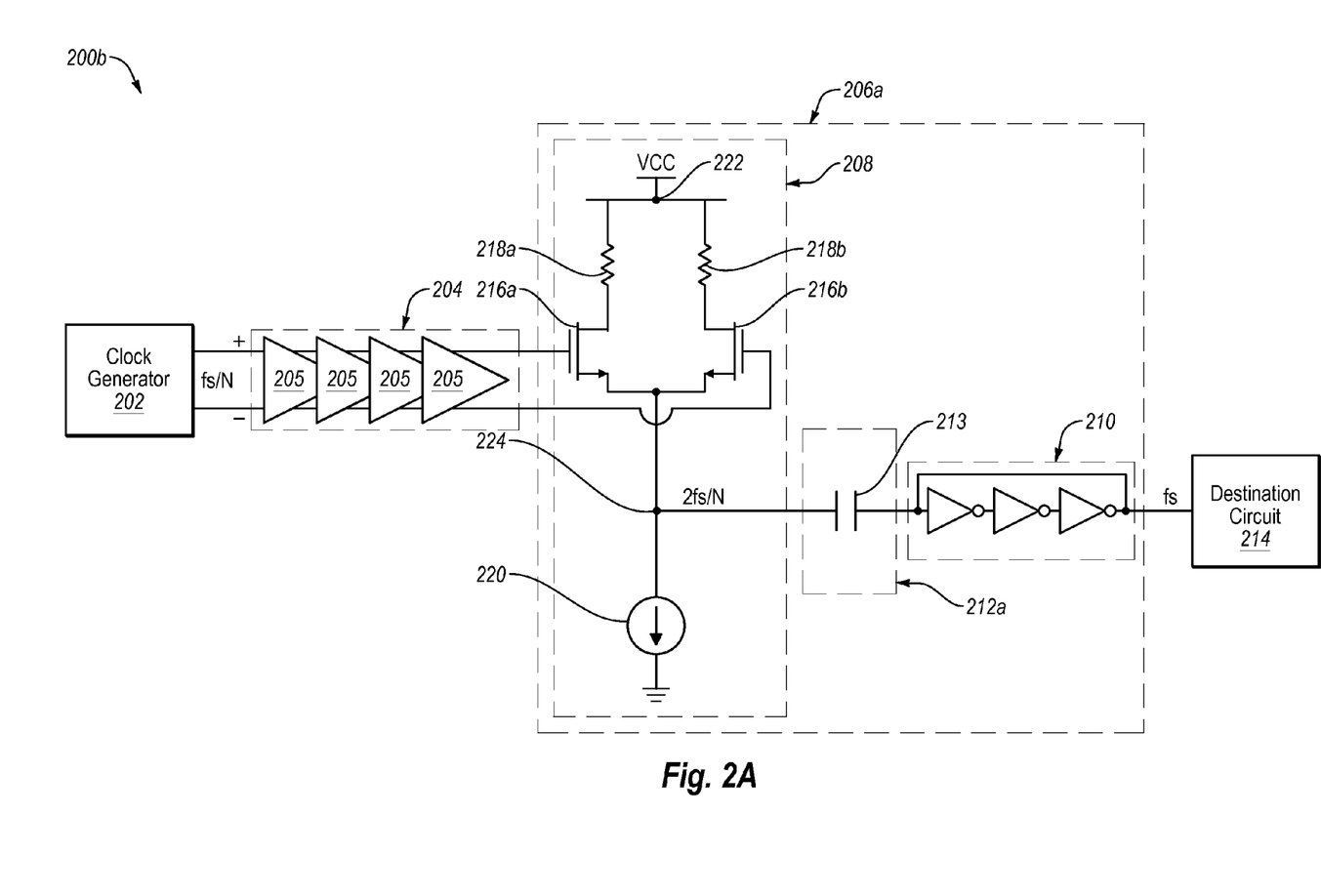
FIG. 2A illustrates another example clock distribution circuit.

FIG. 2A illustrates an example clock distribution circuit 200a ("the circuit 200a"), arranged in accordance with at least one embodiment described herein. The circuit 200a may include a clock generator 202, a clock distributor 204, a frequency multiplying circuit 206a, and a destination circuit 214. The clock generator 202 may be analogous to the clock generator 102 of FIG. 1. In the illustrated embodiment, the clock generator 202 may be configured to generate a first differential clock signal that may include a first positive clock signal and a first negative clock signal. The first differential clock signal may have a first-clock rate that is a sub-harmonic frequency of a desired clock rate "fs" for the destination circuit 214. For example, as in the example of FIG. 1, the first-clock rate may have a frequency that is approximately equal to or equal to "fs/N," where "N" may be an integer.

The clock distributor 204 may be analogous to the clock distributor 104 of FIG. 1 and may be configured to distribute the first differential clock signal from the clock generator 202 to the frequency multiplying circuit 206. In the illustrated example, the clock distributor 204 may include one or more buffers 205 configured to receive and output the first differential clock signal.

The frequency multiplying circuit 206a may include a pulse generator 208 configured to receive the first differential clock signal from the clock distributor 204. In some embodiments, the distance between the clock generator 202 and the pulse generator 208 may be relatively long (e.g., greater than 0.1 mm). The pulse generator 208 may be configured to generate a pulse signal that may have a shorter duty cycle than the first differential clock signal, as explained above.

In the illustrated example, the pulse generator 208 may be configured as a frequency doubler in which the frequency of the pulse signal may be approximately twice the first-clock rate of the first differential clock signal. For example, in the illustrated example, the pulse generator 208 may include a first transistor 216a, a second transistor 216b, a first resistor 218a, a second resistor 218b, and a current source 220 configured such that the pulse generator 208 may receive the first differential clock signal and output the pulse signal as a single ended pulse signal with a reduced duty cycle as compared to the first differential clock signal and with a frequency that is twice the first-clock rate In particular, a gate of the first transistor 216a may be configured to receive the first positive clock signal and a gate of the second transistor 216b may be configured to receive the first negative clock signal. Therefore, the first transistor 216a may be configured such that the first positive clock signal may drive the first transistor 216a and the second transistor 216b may be configured such that the first negative clock signal may drive the second transistor 216b. Further, the first resistor 218a may be electrically coupled between a drain of the first transistor 216a and a voltage supply node 222 that may have a supply voltage Vcc. Similarly, the second resistor 218b may be electrically coupled between a drain of the second transistor 216b and the voltage supply node 222. In addition, the sources of the first transistor 216a and the second transistor 216b may be coupled to an output node 224 of the pulse generator 208. The pulse generator 208 may also include a current source 220 electrically coupled between the output node 224 and ground.

In the illustrated configuration of the pulse generator 208, the current source 220 and the driving of the transistors 216 by the first differential clock signal may create a negative pulse every time the first differential clock signal transitions from "LOW" to "HIGH" or from "HIGH" to "LOW." Therefore, the pulse generator 208 may generate a pulse signal with a frequency that is twice the first-clock rate of the first differential clock signal. For example, when the first-clock rate is "fs/N" the pulse signal may have a frequency that is "2fs/N."

Additionally, in the illustrated configuration of the pulse generator 208, the duration of the pulses may be related to the transition times of the first differential clock signal such that the width of the pulses may be related to the transition times of the first differential clock signal in which shorter transition times may result in narrower pulses. Therefore, the duty cycle of the pulse signal may be related to the transition times of the first differential clock signal and may be less than that of the first differential clock signal. Additionally, because the duty cycle of the pulse signal may be related to the transition times, the sharper the edges of the first differential clock signal are (e.g., the smaller the transition time) the more narrow the pulses may be such that the duty cycle of the pulse signal may be shorter.

The frequency multiplying circuit 206a may also include a high-frequency coupler 212a that may be analogous to the high-frequency coupler 112 of FIG. 1. In the illustrated embodiment of FIG. 2A, the high-frequency coupler 212a may include a capacitor 213 configured to perform the high frequency coupling. The size of the capacitor 213 may be selected based on any suitable selection technique in which the pulse signal may essentially pass through the capacitor 213 and in which low frequencies (e.g., frequencies less than 100 megahertz (MHz)) may not pass through the capacitor 213.

The high-frequency coupler 212a may be disposed between the pulse generator 208 and a sub-harmonic injection locking oscillator 210 (referred to hereinafter as the "sub-harmonic oscillator 210"). The sub-harmonic oscillator 210 may be analogous in functionality to the sub-harmonic oscillator 110 of FIG. 1. In the illustrated embodiment, the sub-harmonic oscillator 210 may be configured as a three stage ring oscillator, as depicted. It is understood that other ring oscillators having different numbers of stages, or other oscillator types, may be used for the sub-harmonic oscillator 210.

The sub-harmonic oscillator 210 may be configured to receive the pulse signal that may pass through the high-frequency coupler 212a and may be configured to generate a second clock signal with a second-clock rate at the desired frequency of "fs" based on the received pulse signal. For example, a free running frequency of the sub-harmonic oscillator 210 may be substantially close to the desired clock rate of "fs" and the pulse signal may have a frequency of "fs/2." The sub-harmonic oscillator 210 may be configured such that it may lock with respect to the desired clock rate of "fs" based on the sub-harmonic pulse frequency of "fs/2."

Additionally, the pulse generator 208 may be configured such that the voltage swings of the pulse signal may allow the sub-harmonic oscillator 210 to perform adequate injection locking. For example, in some embodiments, the pulse generator 208 may be configured such that the voltage swings of the pulse signal may be within tens to hundreds of millivolts. However, the pulse generator 208 may be configured such that the pulse signal has different voltage swings depending on the configuration of the sub-harmonic oscillator 210.

The sub-harmonic oscillator 210 may be electrically coupled to the destination circuit 214 such that the destination circuit 214 may receive the second clock signal at the desired clock rate of "fs" for the destination circuit 214. The sub-harmonic oscillator 210 and the destination circuit 214 may be relatively close to each other as compared to the distance between the clock generator 202 and the frequency multiplying circuit 206a.

Figure 2B:
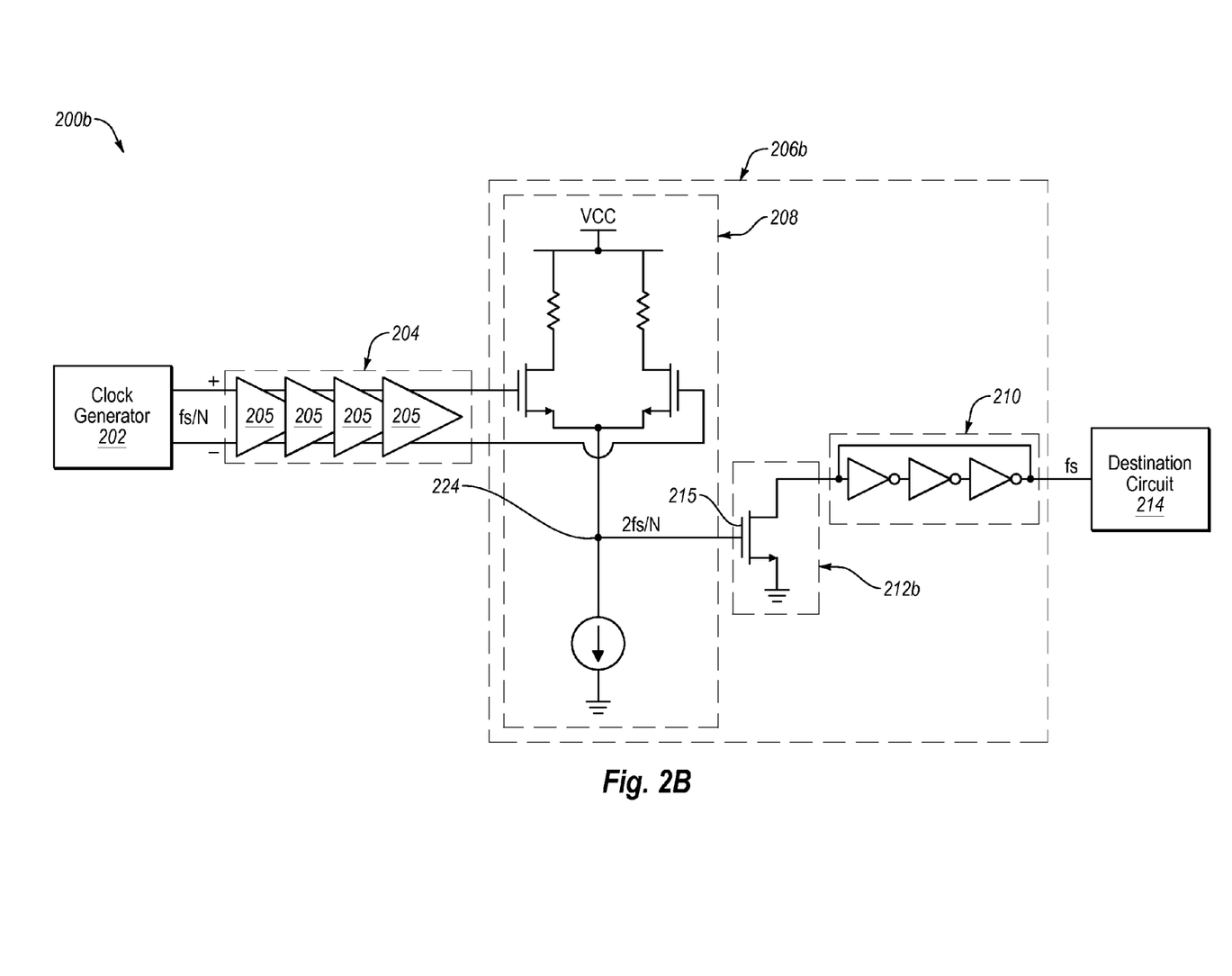
FIG. 2B illustrates another example clock distribution circuit.

Modifications, additions, or omissions may be made to the clock distribution circuit 200a without departing from the scope of the present disclosure. For example, different components and configurations may be used than those specifically depicted. In particular, FIG. 2B, illustrates a modified clock distribution circuit 200b ("the circuit 200b") with respect to the clock distribution circuit 200a, arranged in accordance with at least one embodiment described herein. The circuit 200b may include the clock generator 202, the clock distributor 204, and a multiplying circuit 206b that includes the pulse generator 208, the sub-harmonic oscillator 210 and the destination circuit 214. However, the multiplying circuit 206b may differ from the frequency multiplying circuit 206a of FIG. 2A in that a high-frequency coupler 212b may include a transistor 215. The gate of the transistor 215 may be electrically coupled to the output node 224 of the pulse generator 208 and the drain of the transistor 215 may be electrically coupled to the input of the sub-harmonic oscillator 210. The transistor 215 configured in this manner may allow high frequencies to pass through to the sub-harmonic oscillator 210 but not low frequencies.

In FIGS. 2A and 2B, the transistors are illustrated as metal-oxide-semiconductor field-effect transistor (MOSFET) transistors. Further, the above description uses the nomenclature gate, source, and drain to represent different terminals of the transistors 216. The use of the names gate, source, and drain may be used to describe generically the terminals of a MOSFET transistor, or analogous terminals of other types of transistors, such as bi-polar junction transistors (BJT), junction gate field-effect transistors (JFET), and insulated gate bipolar transistors. Furthermore, P-channel transistors or some combination of n-channel and p-channel transistors may also be used.

Figure 3:
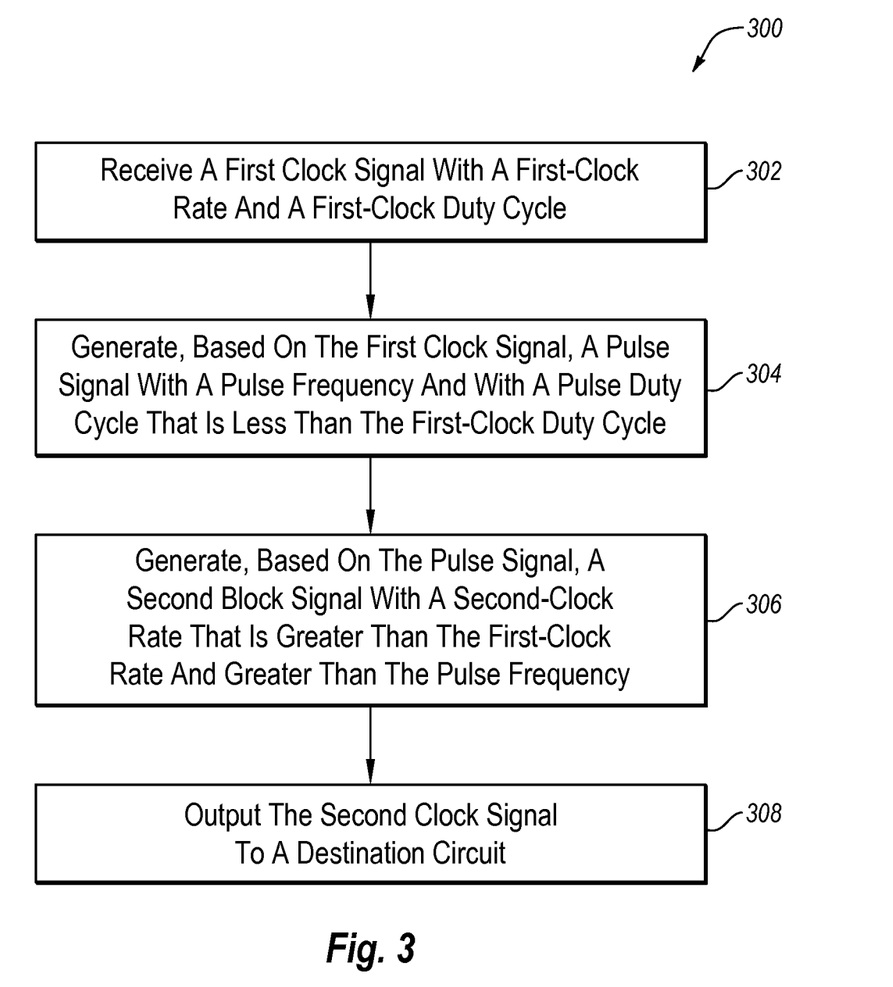
FIG. 3 is a flowchart of an example method of distributing a clock signal.

FIG. 3 is a flowchart of an example method 300 of distributing a clock signal, in accordance with at least one embodiment described herein. The method 300 may be implemented and performed, in some embodiments, by a clock distribution circuit, such as the clock distribution circuits 100, 200a, and 200b, described above. Although illustrated as discrete blocks, various blocks may be divided into additional blocks, combined into fewer blocks, or eliminated, depending on the desired implementation The method 300 may begin at block 302 where a first clock signal may be received from a clock distributor. The first clock signal may be generated by a clock generator that is configured to generate the first clock signal such that it has a first-clock rate that is a sub-harmonic frequency of a desired clock rate. Additionally, the distance of travel of the first clock signal from the clock generator and the clock distributor may be relatively long (e.g., greater than 0.1 mm).

At block 304, a pulse signal may be generated based on the first clock signal. The pulse signal may have a pulse frequency and a pulse duty cycle. In some embodiments, the pulse frequency may be the same as the first-clock rate. In other embodiments, the pulse frequency may be higher than the first-clock rate by a multiplication factor. In these or other embodiments, the pulse frequency and the first-clock rate may be sub-harmonic frequencies with respect to the desired clock rate. Additionally, the pulse duty cycle may be less than the first-clock duty cycle. For example, in some embodiments, the first-clock duty cycle may be 50% and the pulse duty cycle may be 30% or less.

At block 306, a second clock signal may be generated based on the pulse signal. The second clock signal may have a second-clock rate that is greater than the first-clock rate and that is approximately equal to or equal to the desired clock rate. In these or other embodiments, the second-clock rate may also be greater than the pulse frequency.

At block 308, the second clock signal may be output to a destination circuit. The distance of travel of the second clock signal to the destination circuit may be less than the distance of travel of the first clock signal through the clock distributor. In some embodiments, the distance of travel may be significantly less (e.g. less than ⅕ the distance). Therefore, the amount of power consumed in distributing a clock signal having a desired clock rate to the destination circuit may be reduced because the majority of the distance of travel may be done by an associated clock signal with a sub-harmonic clock rate.

Accordingly, the method 300 may be performed to distribute a clock signal in a manner that may reduce the amount of power that may be consumed in distributing the clock signal as compared to other techniques. One skilled in the art will appreciate that, for the method 300 and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For example, in some embodiments, the method 300 may include at least partially blocking low frequencies (e.g., DC) from passing between a pulse generation circuit configured to generate the pulse signal and a sub-harmonic injection locking oscillator configured to receive the pulse signal and generate the second clock signal.

Figure 4:
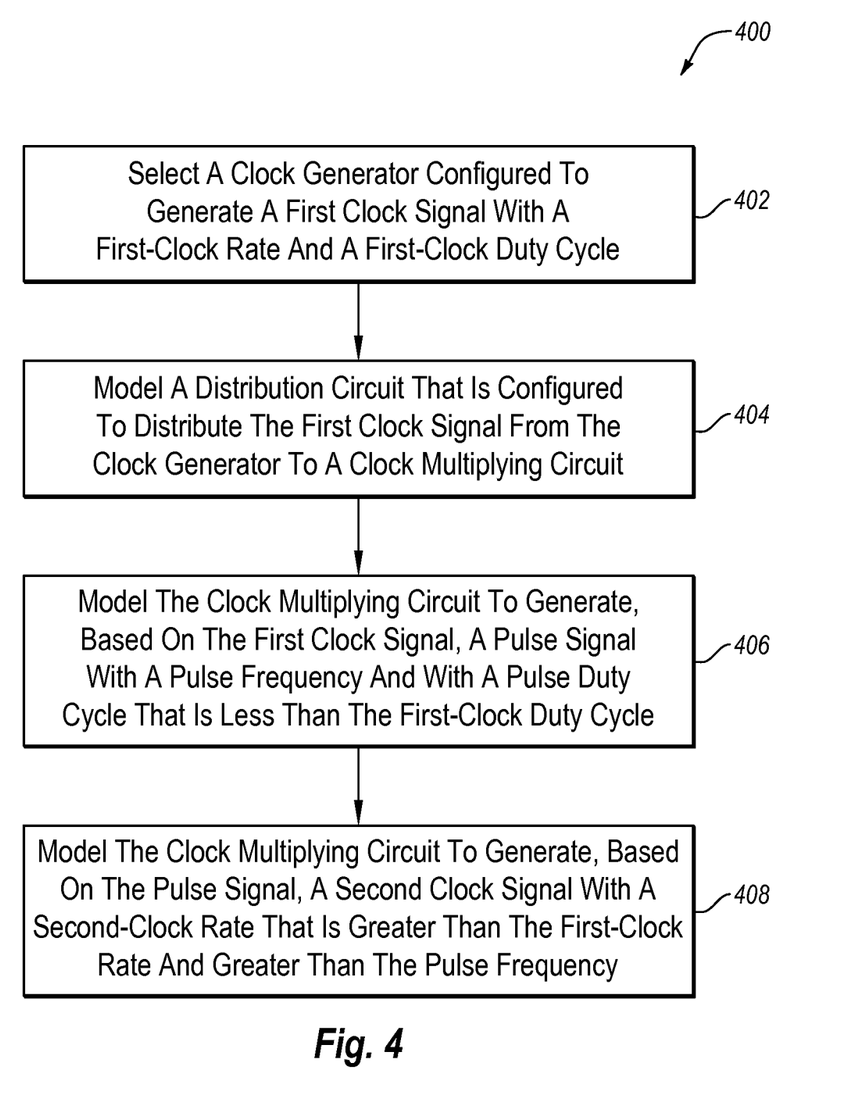
FIG. 4 is a flowchart of an example of designing a clock distribution circuit.

FIG. 4 is a flowchart of an example method 400 of designing a clock distribution circuit, arranged in accordance with at least one embodiment described herein. The method 400 may be implemented, in some embodiments, using any applicable design software stored on a computer-readable storage medium according to the principles described above with respect to the circuits 100, 200a, and 200b, of FIGS. 1, 2A, and 2B, respectively. Although illustrated as discrete blocks, various blocks may be divided into additional blocks, combined into fewer blocks, or eliminated, depending on the desired implementation.

The method 400 may begin at block 402, where a clock generator may be selected. The clock generator may be selected on a configuration in which the clock generator is configured to generate a first clock signal with a first-clock rate that is a sub-harmonic frequency of a desired clock rate. The first clock signal may also have a first-clock duty cycle. In some embodiments, the first-clock duty cycle may be approximately equal to or equal to 50%.

At block 404 a clock distributor (e.g., one or more buffers) may be modeled as distributing the first clock signal from the clock generator to a frequency multiplying circuit. The distance of travel of the first clock signal via the clock distributor may be relatively long in some instances.

At block 406, the frequency multiplying circuit may be modeled to generate a pulse signal based on the first clock signal. The pulse signal may have a pulse frequency that is the same as or greater than the first-clock rate in some embodiments. Additionally, the pulse signal may have a pulse duty cycle that is less than the first-clock duty cycle. For example, in some embodiments, the pulse duty cycle may be less than 30%, whereas the first-clock duty cycle may be 50%. At block 408, the frequency multiplying circuit may be modeled to generate a second clock signal based on the pulse signal. The second clock signal may have a second-clock rate that is greater than the first-clock rate and the pulse frequency. Additionally, the second-clock rate may be approximately equal to or equal to the desired clock rate.

In some embodiments, the frequency multiplying circuit may be modeled according the frequency multiplying circuits 106, 206a, or 206b, described above in some embodiments. Accordingly, in some embodiments, the frequency multiplying circuit may be modeled to include a pulse generator configured to generate the pulse signal based on the first clock signal as described above. In these or other embodiments, the pulse generator may be configured to generate the pulse signal such that the pulse frequency is greater than the first-clock rate by a multiplication factor. Additionally, the pulse generator may be modeled such that a parasitic capacitance at the output of the pulse generator may be sufficiently small to achieve a desired duty cycle of the pulse signal.

Additionally, the frequency multiplying circuit may be modeled to include a sub-harmonic injection locking oscillator configured to generate the second clock signal based on the pulse signal, as described above. The pulse generator may be modeled such that the voltage swings of the pulse signal are sufficient to allow the sub-harmonic injection locking oscillator to achieve its desired injection locking.

One skilled in the art will appreciate that, for the method 400 and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 400 may further include modeling the second clock signal to be received by a destination circuit. In some embodiments, the destination circuit may be electrically closer to the frequency multiplying circuit than the clock generator by a factor of at least five. Therefore, the method 400 may be performed to design a clock distribution circuit such that the clock distribution circuit is configured in a manner that may reduce the amount of power that may be consumed in distributing the clock signal as compared to other clock distribution circuits.

The method 400 described herein may be implemented using any suitable special-purpose or general-purpose computer, computing entity, or processing device including various computer hardware or software modules and may be configured to execute computer-executable instructions stored on any applicable computer-readable media. For example, the method 400 may be performed by a processor that may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data.

Computer-readable media may be any available media that may be accessed by a general-purpose or special-purpose computer (e.g., a processor). By way of example, and not limitation, such computer-readable media may include a non-transitory or tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, or any other storage medium which may be used to carry or store desired program code in the form of computer-executable instructions or data structures and which may be accessed by a general-purpose or special-purpose computer. Combinations of the above may also be included within the scope of computer-readable media. The computer-readable media may include computer-executable instructions which may include, for example, instructions and data that cause a general-purpose computer, special-purpose computer, or special-purpose processing device to perform a certain function or group of functions.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
   a clock generator configured to generate a first clock signal with a first-clock rate and a first-clock duty cycle;
   a clock distributor electrically coupled to the clock generator and including one or more buffers configured to receive the first clock signal generated by the clock generator and to distribute the first clock signal at the first-clock rate and the first-clock duty cycle;
   a pulse generation circuit electrically coupled to the clock distributor and configured to receive the first clock signal distributed by the clock distributor and configured to generate, based on the first clock signal, a pulse signal with a pulse frequency and with a pulse duty cycle that is smaller than the first-clock duty cycle; and
   a sub-harmonic injection locking oscillator electrically coupled to the pulse generation circuit and configured to receive the pulse signal and to output, based on the pulse signal, a second clock signal with a second-clock rate that is greater than the first-clock rate and greater than the pulse frequency, wherein the pulse generation circuit and the sub-harmonic injection locking oscillator are included on a same encapsulated silicon die.

2. The circuit of claim 1, further comprising a high-frequency coupler electrically disposed between the pulse generation circuit and the sub-harmonic injection locking oscillator such that the high-frequency coupler blocks a direct current from passing between the pulse generation circuit and the sub-harmonic injection locking oscillator.

3. The circuit of claim 2, wherein the high-frequency coupler comprises one or more of a capacitor and a transistor.

4. The circuit of claim 1, wherein the pulse generation circuit, the sub-harmonic injection locking oscillator, the clock generator, and the clock distributor are disposed on the same encapsulated silicon die.

5. The circuit of claim 1, wherein the first-clock duty cycle is 50% and the pulse duty cycle is less than 30%.

6. The circuit of claim 1, wherein the pulse generation circuit further includes a frequency multiplier such that the pulse frequency is higher than the first-clock rate by a multiplication factor.

7. The circuit of claim 1, wherein the sub-harmonic injection locking oscillator comprises a ring oscillator.

8. The circuit of claim 1, wherein a free-running oscillation frequency of the sub-harmonic injection locking oscillator is approximately equal to an integer multiple of the pulse frequency and is substantially equal to the second-clock rate.

9. The circuit of claim 1, wherein the first-clock rate and the pulse frequency are sub-harmonic frequencies with respect to the second-clock rate.

10. A method comprising:
receiving, by a frequency multiplying circuit from a clock distributor that includes one or more buffers, a first clock signal with a first-clock rate and a first-clock duty cycle, the first clock signal being generated by a clock generator and passing from the clock generator to the clock distributor and being distributed by the one or more buffers of the clock distributor, the first clock signal travelling over a first distance of travel between the clock generator and the frequency multiplying circuit via the one or more buffers of the clock distributor;
generating, by a pulse generation circuit of the frequency multiplying circuit based on the first clock signal, a pulse signal with pulse frequency and with a pulse duty cycle that is smaller than the first-clock duty cycle;
generating, by a sub-harmonic injection locking oscillator of the frequency multiplying circuit based on the pulse signal, a second clock signal with a second-clock rate that is greater than the first-clock rate and greater than the pulse frequency, wherein the pulse generation circuit and the sub-harmonic injection locking oscillator are disposed on a same encapsulated silicon die; and
outputting the second clock signal to a destination circuit, a second distance of travel of the second clock signal between the frequency multiplying circuit and the destination circuit being less than the first distance of travel of the first clock signal between the clock generator and the frequency multiplying circuit.

11. The method of claim 10, further comprising blocking a direct current from passing between a pulse generation circuit configured to generate the pulse signal and a sub-harmonic injection locking oscillator configured to receive the pulse signal and generate the second clock signal.

12. The method of claim 10, wherein the first-clock duty cycle is 50% and the pulse duty cycle is less than 30%.

13. The method of claim 10, further comprising generating the pulse signal such that the pulse frequency is higher than the first-clock rate by a multiplication factor.

14. The method of claim 10, wherein the first-clock rate and the pulse frequency are sub-harmonic frequencies with respect to the second-clock rate.

15. A method of designing a circuit, the method comprising:
selecting a clock generator configured to generate a first clock signal with a first-clock rate that is a sub-harmonic frequency of a target clock rate and with a first-clock duty cycle;
modeling a clock distributor that includes one or more buffers configured to distribute the first clock signal from the clock generator to a frequency multiplying circuit;
modeling the frequency multiplying circuit such that each of its components are on a same encapsulated silicon die and to generate, based on the first clock signal, a pulse signal with pulse frequency and with a pulse duty cycle that is smaller than the first-clock duty cycle; and
modeling the frequency multiplying circuit to generate, based on the pulse signal, a second clock signal with a second-clock rate that is approximately equal to or equal to the target clock rate and that is greater than the first-clock rate and greater than the pulse frequency.

16. The method of claim 15, wherein the first clock signal is modeled as travelling over a first distance of travel between the clock generator and the frequency multiplying circuit via the one or more buffers of the clock distributor and the method further comprises modeling the second clock signal to be received by a destination circuit in which the second clock signal is modeled as travelling over a second distance of travel between the frequency multiplying circuit and the destination circuit, the second distance of travel being less than the first distance of travel by a factor of at least five.

17. The method of claim 15, further comprising modeling the frequency multiplying circuit to include a pulse generator configured to generate the pulse signal and to include a sub-harmonic injection locking oscillator configured to receive the pulse signal and generate the second clock signal based on the pulse signal.

18. The method of claim 17, further comprising modeling the pulse generator to generate the pulse signal such that the pulse frequency is greater than the first-clock rate by a multiplication factor.

19. The method of claim 15, wherein the first-clock duty cycle is 50% and the pulse duty cycle is less than 30%.

* * * * *